US012705510B2

(12) United States Patent
Kulkarni

(10) Patent No.: US 12,705,510 B2
(45) Date of Patent: Aug. 11, 2026

(54) ADAPTIVE CAUSE AND EFFECT RULES FOR EMERGENCY EVACUATION

(71) Applicant: Honeywell International Inc., Charlotte, NC (US)

(72) Inventor: Sagar Ramesh Kulkarni, Bangalore (IN)

(73) Assignee: Honeywell International Inc., Charlotte, NC (US)

(*) Notice: Subject to any disclaimer, the term of this patent is extended or adjusted under 35 U.S.C. 154(b) by 662 days.

(21) Appl. No.: 18/133,747

(22) Filed: Apr. 12, 2023

(65) Prior Publication Data

US 2024/0346344 A1 Oct. 17, 2024

(51) Int. Cl.

*A62B 3/00* (2006.01)
*G06F 30/20* (2020.01)
*G06N 5/025* (2023.01)
*H04N 7/18* (2006.01)

(52) U.S. Cl.

CPC ............... *G06N 5/025* (2013.01); *A62B 3/00* (2013.01); *G06F 30/20* (2020.01); *H04N 7/181* (2013.01)

(58) Field of Classification Search

CPC .................... G06Q 20/00–425; H04L 9/00–50
See application file for complete search history.

(56) References Cited

U.S. PATENT DOCUMENTS

2018/0061217 A1* 3/2018 Eichler ................ G08B 29/123
2022/0230528 A1* 7/2022 Wedig .................. G08B 25/016
2023/0034481 A1* 2/2023 Benton .................. G08B 17/10

FOREIGN PATENT DOCUMENTS

EP 3719774 A1 10/2020

* cited by examiner

*Primary Examiner* — Ari Shahabi
(74) *Attorney, Agent, or Firm* — Brooks, Cameron & Huebsch, PLLC

(57) ABSTRACT

Systems, methods, and devices for adaptive cause and effect rules for emergency evacuation are described herein. One method includes performing a plurality of fire drills at a facility having a fire control panel, receiving data associated with each of the plurality of fire drills, and modifying cause and effect rules stored and implemented by the fire control panel based on the received data.

4 Claims, 3 Drawing Sheets

ADAPTIVE CAUSE AND EFFECT RULES FOR EMERGENCY EVACUATION

TECHNICAL FIELD

The present disclosure relates to adaptive cause and effect for emergency evacuation.

BACKGROUND

Facilities equipped with alarm systems allow for early detection of an emergency event, such as a fire and/or presence of a harmful chemical. Alarm systems utilize sensing devices (e.g., fire detectors, smoke detectors, chemical sensors, hand pull devices, etc.) spread throughout the facility that can detect when an event may be occurring. These alarm system devices communicate sensor information to an on premise alarm system control panel that collects and analyzes the data to determine whether an emergency event is occurring A facility may be evacuated following the detection of an emergency as a matter of course. Evacuation in an orderly manner can save lives by preventing stampedes from panic, for instance.

Typically, such facilities are large and can be complex (e.g., large building, multiple floors, facilities with multiple buildings). Evacuating such a facility may be carried out according to an evacuation plan. However, evacuation plans in previous approaches may be static and rarely (if ever) improved upon. Moreover, it may be difficult in previous approaches to determine the effectiveness of an evacuation plan

DETAILED DESCRIPTION

Figure 1:
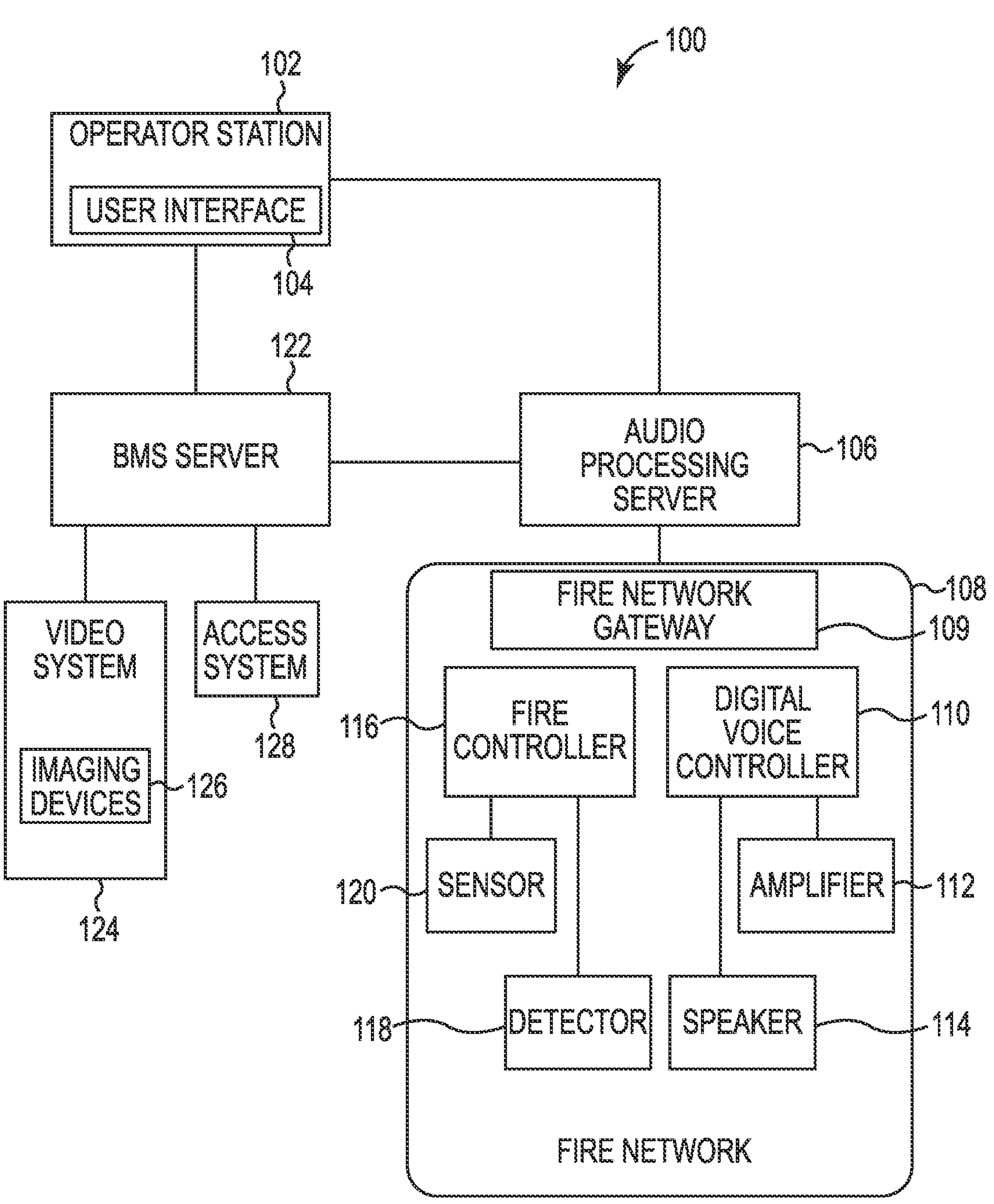
FIG. 1 illustrates a system for adaptive C&E rules for emergency evacuation in accordance with one or more embodiments of the present disclosure.

A facility may be evacuated following the detection of an emergency. Evacuation in an orderly manner can save lives by preventing stampedes. Evacuating a facility may be carried out in an orderly manner according to an evacuation plan. However, evacuation plans in previous approaches may be static and rarely (if ever) improved upon. Moreover, it may be difficult in previous approaches to determine the effectiveness of an evacuation plan.

Cause and Effect (C&E) rules play a vital role in event alarm systems. C&E rules provide the process of mapping, initiating sensors, and notification appliances to interoperate to identify particular events and provide correspondingly appropriate particular notifications to users of the alarm system, occupants of the facility, system monitoring personnel, emergency personnel, facility ownership, and/or system maintenance personnel based on the particular type of event identified. Activating appropriate audible and/or visual notifications, initiating voice alarm notifications, playing evacuation and/or alert messages on a user's computing device at a right time and/or in the right places are important factors to life safety at a facility.

Currently, during commissioning of an alarm system control panel at the facility, the commissioning engineer references a floor plan and/or as-built drawings to create C&E rule based logic. However, the drawings may not be updated to the latest modifications that the facility has gone through. In addition, typical C&E does not take into account the current locations of people within a facility.

Further, in current systems, mapping appropriate inputs and/or outputs for causes and effects is a manual process and time-consuming activity even when a configuration tool is used. The manual process of mapping C&E can cause a risk of missing an input device, especially in large sites like airports, multistory buildings, casinos, hotels, shopping malls, warehouses, etc. Updating C&E based on recent changes that occur is tedious and a continuous process for technicians.

Embodiments of the present disclosure can dynamically adapt an evacuation plan to site-specific conditions, resulting in safer and more efficient evacuations compared to previous approaches. Cause and Effect rules from the commissioning of a system can be modified to improve evacuation strategies to prevent congestion, panic, and/or stampedes. For instance, in some embodiments, artificial intelligence (AI) can be deployed to suggest modifications that improve efficiency and safety.

In the following detailed description, reference is made to the accompanying drawings that form a part hereof. The drawings show by way of illustration how one or more embodiments of the disclosure may be practiced.

These embodiments are described in sufficient detail to enable those of ordinary skill in the art to practice one or more embodiments of this disclosure. It is to be understood that other embodiments may be utilized and that process, electrical, and/or structural changes may be made without departing from the scope of the present disclosure.

As will be appreciated, elements shown in the various embodiments herein can be added, exchanged, combined, and/or eliminated so as to provide a number of additional embodiments of the present disclosure. The proportion and the relative scale of the elements provided in the figures are intended to illustrate the embodiments of the present disclosure and should not be taken in a limiting sense.

The figures herein follow a numbering convention in which the first digit or digits correspond to the drawing figure number and the remaining digits identify an element or component in the drawing. Similar elements or components between different figures may be identified by the use of similar digits. For example, 106 may reference element "06" in FIG. 1, and a similar element may be referenced as 206 in FIG. 2.

As used herein, "a", "an", or "a number of" something can refer to one or more such things, while "a plurality of" something can refer to more than one such things. For example, "a number of components" can refer to one or more components, while "a plurality of components" can refer to more than one component.

FIG. 1 illustrates a system 100 for adaptive C&E rules for emergency evacuation in accordance with one or more embodiments of the present disclosure. As shown in FIG. 1, system 100 can include an operator station 102, an audio processing server 106, a fire network 108, a BMS server 122, a video system 124, and an access system 128. However, systems for in accordance with embodiments of the present disclosure are not limited to the embodiment illustrated in FIG. 1 (e.g., various systems can include elements not illustrated in system 100 and/or exclude elements illustrated in system 100).

Operator station 102 can be a computing device (e.g., having a processor and a memory as discussed below in connection with FIG. 2). Although one operator station is shown in FIG. 1, embodiments of the present disclosure can include multiple operator stations. Various users can access operator station 102 and each user can be authenticated before being allowed access.

Operator station 102 can include a user interface (e.g., display) 104. User interface 104 can be and/or include various display technologies such as, for example, liquid crystal display (LCD), light emitting diode (LED) display, cathode ray tube (CRT) display, etc., and can display videos, data, and/or information to one or more users. Operator station 102 can include additional components such as one or more microphones, for instance, among others (not shown in FIG. 1). Audio processing server 106 can include one or more devices (e.g., computing devices not shown in FIG. 1) configured to perform various functions discussed below (e.g., audio data encryption), for instance.

As shown in FIG. 1, fire network 108 can include a fire network gateway 109, a digital voice controller 110 coupled to a speaker 114 and an amplifier 112, and a fire controller 116 coupled to a detector 118 and a sensor 120. However, fire networks in accordance with embodiments of the present disclosure are not limited to the particular devices illustrated in FIG. 1. For example, fire network 108 can include multiple sensors, detectors, speakers and/or amplifiers, among other devices.

Fire network gateway 109 can be a component configured to control a rate at which audio is sent to controllers of fire network 108 (e.g., digital voice controller 110 and/or fire controller 116). For example, fire network gateway 109 can allow maintaining of audio quality and/or prevention of buffer underrun and/or overrun. Digital voice controller 110 can be a device configured to interface with and/or manage various audio devices (e.g., amplifier 112 and/or speaker 114). Amplifier 112 can be various types of amplifiers, and embodiments of the present disclosure are not limited to particular types of amplifiers. Similarly, speaker 114 can be various types of speakers, and embodiments of the present disclosure are not limited to particular types of speakers. For example, a facility can include a plurality of digital voice controllers, speakers, and/or amplifiers of various types, for instance, dispersed throughout the facility.

Fire controller 116 can be a device configured to interface with and/or manage various fire devices (e.g., detector 118 and/or sensor 120). The fire controller 116 can be a fire control panel. As used herein, the term "control panel" refers to a device at the facility to control components of an alarm system of a facility (e.g., building). For example, the fire controller 116 can be a fire control panel that can receive information from event detection devices and determine whether an emergency event (e.g., a fire) is occurring or has occurred. As discussed further below, the fire controller 116 can store C&E rules. In some embodiments, the C&E rules are included in a configuration file stored by the fire controller 116.

As used herein, the term "alarm system event detection device" refers to a device that can send data regarding an event occurring in the device's coverage area (where it can sense an event occurring) and/or receive an input relating to an event. Such alarm system event detection devices can be a part of an alarm system of the facility and can include devices such as fire sensors, smoke detectors, heat detectors, carbon monoxide (CO) detectors, other chemical detector(s), or combinations of these; interfaces; pull stations; input/output modules; aspirating units; and/or audio/visual devices, such as speakers, sounders, buzzers, microphones, cameras, video displays, video screens, and other detector devices, among other types of alarm system devices.

Accordingly, detector 118 can be various types of detectors (e.g., a smoke detector), and embodiments of the present disclosure are not limited to particular types of detectors. Similarly, sensor 120 can be various types of sensors (e.g., a temperature sensor), and embodiments of the present disclosure are not limited to particular types of sensors. For example, a facility can include a plurality of fire controllers, detectors, and/or sensors of various types, for instance, dispersed throughout the facility.

BMS server 122 can include one or more devices (e.g., computing devices, not shown in FIG. 1) configured to perform various functions discussed below, for instance. BMS server 122 can interact with and/or manage various systems and/or subsystems of a BMS system (e.g., energy systems, heating, ventilating, and air conditioning (HVAC) systems, etc.) (not illustrated in FIG. 1).

In some embodiments, BMS server 122 and/or operator station 102 can be located separately (e.g., remotely, such as in a different geographical location and/or facility) with respect to audio processing server 106, fire network 108, video system 124, and/or access system 128. Whereas audio processing server 106, fire network 108, video system 124, and/or access system 128 can be associated with a particular facility, locations associated with BMS server 122 and/or operator station 102 are not so limited. For example, operator station 102 can be located at a first geographical location (e.g., a BMS command center), and fire network 108, video system 124, and/or access system 128 can be located at a second geographical location (e.g., the facility).

Video system 124 can manage a video system associated with a facility. Video system 124 can include a plurality of imaging devices 126 and/or one or more computing devices (not illustrated in FIG. 1). Imaging devices 126 can be various types of imaging devices (e.g., video cameras), and embodiments of the present disclosure are not limited to particular types of imaging devices. For example, imaging devices 126 can be dispersed throughout a facility. Each of imaging devices 126 can capture a respective video of a portion of a facility and communicate the captured video to operator station 102, for instance.

Access system 128 can manage access, security, and/or occupancy associated with a facility. Access system 128 can include various sensors, identification card scanners, lighting systems, alarm systems, etc. (not shown in FIG. 1). Although shown in FIG. 1 as being separate from video system 124 in some embodiments, access system 128 can be integrated and/or correlated with video system 124.

A user can be authenticated and/or gain access to operator station 102 such that the user can visualize user interface 104. User interface 104 can display various interfaces that can be customized by the user, for instance. For example, user interface 104 can display a graphical representation of the facility, fire network 108 and/or a portion of fire network 108. Such a graphical representation can include a floor plan (e.g., two or three-dimensional rendering) of a facility housing fire network 108, for instance, along with locations (e.g., denoted by icons) of various components of fire network 108 (e.g., digital voice controller 110, amplifier 112, and/or speaker 114). Such a graphical representation can include a hierarchical tree view form of the facility model (e.g., derived from existing facility model of the BMS). Such components may be selectable in various manners (e.g., a mouse click).

The graphical representation can include depictions of entities in the facility. In some embodiments, for instance, the locations of people can be depicted using display elements. In some embodiments, a fire, or other cause of an emergency can be depicted graphically with animations.

An event alarm signal can be generated in response to data from one or more alarm system event detection devices (e.g., detector 118 and/or sensor 120) indicating that an event (e.g., fire, emergency situation, etc.) may be occurring. As used herein, the term "event" may refer to any condition occurring within the building, such as a fire, smoke, or chemical sensor activation, an alarm trigger (pull station), or a breach of security.

The fire controller 116 may be configured to transmit information about the emergency event to a computing device and/or a remote network (e.g., a cloud-based network). This information, may include, for example, a unique identifier of the event detection device which detected the event, a date and/or time of the event, a status of the event (e.g., resolved, unresolved), and/or an event type (e.g., smoke detected, communication fault).

Floorplans of each floor of the building may be accessible through the computing device operator station 102. For example, such floorplans may be stored in the memory of the BMS server 1122. These building floorplans may be configured to include specific locations of all of the alarm system event detection devices. These floorplans may be accessed, and portions of the plans may be transferred to the operator station 102 to enable the creation of a visual floor representation as described herein.

Figure 2:
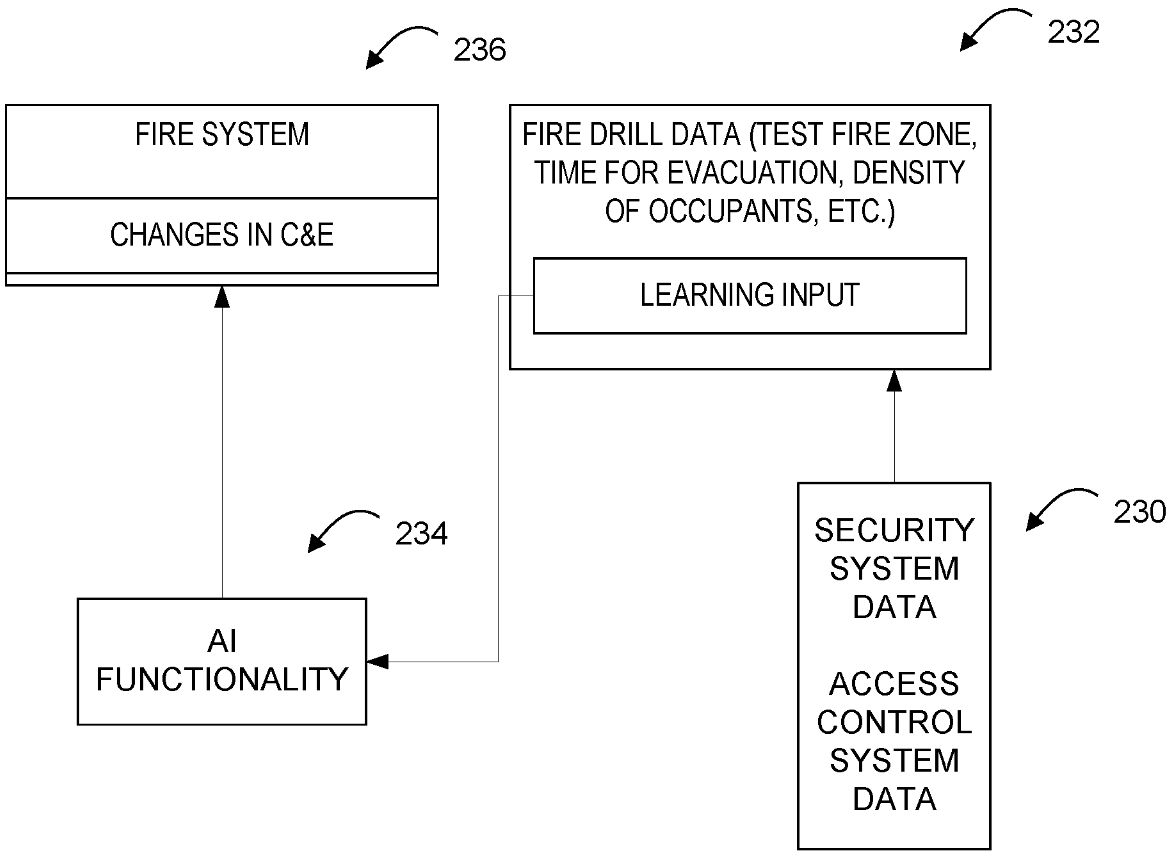
FIG. 2 illustrates a flow chart associated with adaptive cause and effect rules for emergency evacuation in accordance with one or more embodiments of the present disclosure.

FIG. 2 illustrates a flow chart associated with adaptive cause and effect rules for emergency evacuation in accordance with one or more embodiments of the present disclosure. At 230, security system data and access control data can be received as learning input. The learning input can include data associated with fire drills (referred to herein as "fire drill data 232"). Generally, fire drill data 232 is data that is descriptive of one or more fire drills performed at a facility. More specifically, fire drill data 232 is data that describes the effectiveness and/or efficiency of an evacuation strategy (e.g., the cause and effect rules in place when the evacuation is performed). Fire drill data 232 includes closed circuit television (CCTV) feeds, security camera video, the zone(s) of the facility in which the simulated fire started and/or spread into, the time taken for evacuating a room, zone, and/or facility, the quantity of occupants in a zone and in the facility, the density of occupants in a zone and in the facility, the distribution of occupants in a zone and in the facility, etc.

As previously discussed, some fire drill data 232 can be received from a security system in the facility. Other fire drill data 232 can be received from an access control system of the facility. Access control systems control access to various portions of a facility and can include several different types of devices such as card readers, access readers, wireless beacons, and/or presence sensors, for instance. Access control systems can inform embodiments herein about the movements of people within the facility and within different portions (e.g., zones of a facility).

The fire drill data 232 under a set of C&E rules can be used as learning input for an artificial intelligence (AI) functionality 234. The AI functionality 234 can include a machine learning model in some embodiments. Machine learning models can include supervised learning, unsupervised learning, regression, instance-based, decision tree, Bayesian, clustering, artificial neural networks, deep learning, among other types of machine learning techniques. The AI functionality 234 can analyze the fire drill data 232 and determine modifications to the C&E 236 of the fire control panel.

Modifications to the C&E 236 include modifications to zonal evacuation strategies based on where a fire is detected. It may be, for instance, that the strategy determined at commissioning results in unforeseen bottlenecks and/or inefficiencies during evacuation. Evacuating different zones in different orders may alleviate these issues. Generally, the faster that the entire facility is evacuated the better. However, a more targeted evacuation beginning with the zones most likely to be affected by a fire in a given location may result in less bottlenecking and/or panicking (which may lead to potentially deadly stampedes).

Figure 3:
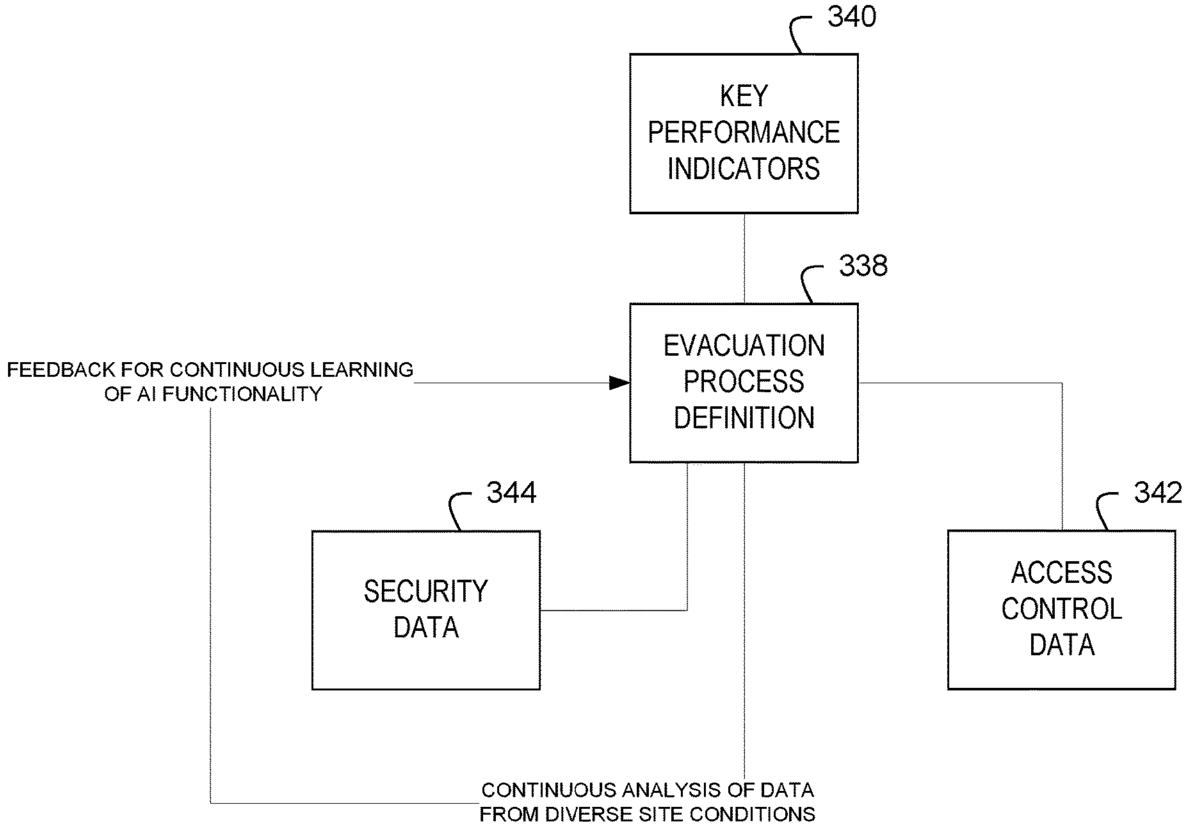
FIG. 3 illustrates another flow chart associated with adaptive cause and effect rules for emergency evacuation in accordance with one or more embodiments of the present disclosure.

FIG. 3 illustrates another flow chart associated with adaptive cause and effect rules for emergency evacuation in accordance with one or more embodiments of the present disclosure. An evacuation process definition 338 can receive inputs including key performance indicators (KPIs) 340 of evacuation effectiveness over a period that includes a plurality of fire drills. These KPIs 340 can include zone-wise time to evacuate and/or stampede probability, among others. The evacuation process definition 338 can receive inputs including access control data 342. Access control data 342 can include spatial density pattern analysis via occupancy detection and/or occupancy prediction as occupants move throughout the facility during drill evacuations. The evacuation process definition 338 can receive security data (e.g., video footage) 344. Security data 344 can include footage of crowd movement and/or flow during drill evacuations. Continuous analysis of the KPIs, 340, the access control data 342, and the security data 344 forms feedback for continuous learning of the AI described herein.

Although specific embodiments have been illustrated and described herein, those of ordinary skill in the art will appreciate that any arrangement calculated to achieve the same techniques can be substituted for the specific embodiments shown. This disclosure is intended to cover any and all adaptations or variations of various embodiments of the disclosure.

It is to be understood that the above description has been made in an illustrative fashion, and not a restrictive one. Combination of the above embodiments, and other embodiments not specifically described herein will be apparent to those of skill in the art upon reviewing the above description.

The scope of the various embodiments of the disclosure includes any other applications in which the above structures and methods are used. Therefore, the scope of various embodiments of the disclosure should be determined with reference to the appended claims, along with the full range of equivalents to which such claims are entitled.

In the foregoing Detailed Description, various features are grouped together in example embodiments illustrated in the figures for the purpose of streamlining the disclosure. This method of disclosure is not to be interpreted as reflecting an intention that the embodiments of the disclosure require more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed:

1. A system, comprising:

a security system of a facility configured to collect security data;

an access control system of the facility configured to collect access control data;

a plurality of audio and visual notification devices;

a fire control panel of the facility configured to:

store a set of cause and effect rules for operating the plurality of audio and visual notification devices in evacuating the facility;

perform a plurality of fire drills at the facility;

receive security data associated with each of the plurality of fire drills from the security system;

receive access control data associated with each of the plurality of fire drills from the access control system; and modify the cause and effect rules based on the received security system data and the received access control data, including modifying operations of the plurality of audio and visual notification devices during an evacuation of the facility; and a computing device configured to display the access control data, the security data, and visualizations of the plurality of fire drills.

2. The system of claim 1, wherein the security system includes a plurality of video cameras installed in the facility.

3. The system of claim 1, wherein the access control system includes a plurality of access readers installed in the facility.

4. The system of claim 1, wherein the computing device is configured to create a visual floor representation from floorplans of the facility.

* * * * *